(12) United States Patent
Lee et al.

(10) Patent No.: US 10,614,873 B2
(45) Date of Patent: Apr. 7, 2020

(54) MEMORY DEVICE, MEMORY SYSTEM INCLUDING THE SAME, AND ADDRESS COUNTING AND COMPARING OPERATION FOR REFRESH OPERATION METHOD THEREOF

(71) Applicant: SK hynix Inc., Gyeonggi-do (KR)

(72) Inventors: Woo-Young Lee, Gyeonggi-do (KR);
Duck-Hwa Hong, Seoul (KR);
Jung-Hyun Kim, Gyeonggi-do (KR);
Jae-Hoon Cha, Gyeonggi-do (KR);
Jeong-Tae Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 199 days.

(21) Appl. No.: 15/727,741

(22) Filed: Oct. 9, 2017

(65) Prior Publication Data

US 2018/0182445 A1 Jun. 28, 2018

(30) Foreign Application Priority Data

Dec. 26, 2016 (KR) .................. 10-2016-0179338

(51) Int. Cl.
*G11C 8/04* (2006.01)
*G11C 11/408* (2006.01)
*G11C 11/406* (2006.01)
*G11C 8/06* (2006.01)

(52) U.S. Cl.
CPC .............. *G11C 11/408* (2013.01); *G11C 8/04* (2013.01); *G11C 8/06* (2013.01); *G11C 11/406* (2013.01); *G11C 11/4082* (2013.01)

(58) Field of Classification Search
CPC ........... G11C 8/04; G11C 8/06; G11C 11/406; G11C 11/408; G11C 11/4082
See application file for complete search history.

(56) References Cited

U.S. PATENT DOCUMENTS 9,508,415 B2 * 11/2016 Kim ................. G11C 11/40611

FOREIGN PATENT DOCUMENTS

KR 1020150002128 1/2015
KR 1020150018164 2/2015

* cited by examiner

*Primary Examiner* — Larry T Mackall
(74) *Attorney, Agent, or Firm* — IP & T Group LLP

(57) ABSTRACT

A memory device may include first and second latch sections configured to respectively store a target address and a recent input address, a comparison unit configured to compare an input address with the target address and the recent input address respectively stored in the first and second latch sections, and output a resultant signal, a counting section configured to increase a count corresponding to the recent address stored in the second latch section in response to the resultant signal, and a control unit configured to check the count of the counting section and update the input address to the second latch section in response to the resultant signal.

20 Claims, 6 Drawing Sheets

MEMORY DEVICE, MEMORY SYSTEM INCLUDING THE SAME, AND ADDRESS COUNTING AND COMPARING OPERATION FOR REFRESH OPERATION METHOD THEREOF

CROSS-REFERENCE TO RELATED APPLICATIONS

The present application claims priority of Korean Patent Application No. 10-2016-0179338, filed on Dec. 26, 2016, which is incorporated herein by reference in its entirety.

BACKGROUND

1. Field

Exemplary embodiments relate to a memory system, and more particularly, to a memory system for performing a refresh operation of a memory device and an operation method thereof.

2. Description of the Related Art

A volatile memory device such as a Dynamic Random Access Memory (DRAM) may configure a memory cell for storing data by using a transistor serving as a switch and a capacitor for storing data in the form of a charge. Accordingly, a logic high level or a logic low level of data may be determined according to the charge in the capacitor of the memory cell, that is, whether a voltage across the capacitor is high or low.

In principle, there should be no power consumption involved in the storing of data, since the storing of data involves maintaining an already accumulated charge in the capacitor. However, it is well known that the initial amount of charge stored in the capacitor of a memory cell may decrease over time due to a leakage current caused by a PN junction of a MOS type transistor employed in the memory cell and eventually the stored charge i.e., the stored data may be lost. In order to prevent such data losses, it is generally necessary to read the data in the memory cells of a memory device before the data is lost and recharge the memory cells with a normal charge amount according to the read data. Such recharge operation of the memory cells is referred to as a refresh operation and is typically performed periodically for retaining the data stored in the memory cells of a memory device.

Meanwhile, because of the continuous increase in the degree of integration of memory devices, the interval between adjacent word lines in the memory device is reduced, which may result in an increase of a coupling effect between adjacent word lines. Because of the coupling effect, when a certain word line is frequently activated, the data of memory cells electrically coupled to adjacent word lines may be damaged.

Hence, when a specific word line is repeatedly activated in a time threshold value, that is, when the specific word line is hammered or a row hammer event occurs, data of memory cells electrically coupled to word lines physically adjacent to the specific word line may be affected. A leakage current and a parasitic current caused by repeated access to a specific word line may drift data corresponding to non-accessed word lines physically adjacent to the specific word line. Such drift, influence and the like of the data between word lines are herein referred to as a row disturbance phenomenon.

FIG. 1 is a diagram illustrating a part of a cell array included in a memory device, for explaining a row disturbance phenomenon.

Referring to FIG. 1, 'BL' indicates a bit line and 'WLK−1', 'WLK', and 'WLK+1' indicate first to third word lines arranged in a row. The first word line WLK marked with 'HIGH_ACT' is a word line frequently activated, and the second word lines WLK−1 and WLK+1 are word lines arranged adjacent to the first word line WLK. Also, 'CELL_K−1', 'CELL_K', and 'CELL_K+1' indicate memory cells electrically coupled to the first to third word lines WLK−1, WLK, and WLK+1, respectively. The memory cell CELL_K−1 includes a cell transistor TR_K−1 and a cell capacitor CAP_K−1, and the memory cell CELL_K includes a cell transistor TR_K and a cell capacitor CAP_K, and the memory cell CELL_K+1 includes a cell transistor TR_K+1 and a cell capacitor CAP_K+1.

In FIG. 1, when the first word line WLK is activated and precharged (deactivated), since voltages of the second and third word lines WLK−1 and WLK+1 rise and fall due to a coupling phenomenon occurring between the first word line WLK and the second and third word lines WLK−1 and WLK+1, the amount of charge stored in the cell capacitors CAP_K−1 and CAP_K+1 is affected. Accordingly, when the first word line WLK is frequently activated and precharged, that is, the first word line WLK is toggled between the activated state and the precharged state, data stored in the memory cells CELL_K−1 and CELL_K+1 may be damaged due to a change in the amount of charge stored in the cell capacitors CAP_K−1 and CAP_K+1.

Furthermore, since an electromagnetic wave generated when the word line is toggled between the activated state and the precharged state enables inflow/outflow of electrons of the cell capacitors included in the memory cells electrically coupled to adjacent word lines, data of the memory cells may be damaged. Accordingly, when a relatively frequently accessed word line is detected, adjacent word lines of the detected word line are subjected to a refresh operation, that is, a target refresh operation, so that the row disturbance phenomenon of the memory device may be reduced.

SUMMARY

Various embodiments are directed to a memory system capable of stably retaining data by checking a repetitive access operation on a memory device to perform a refresh operation, and an operation method thereof.

In accordance with an embodiment of the present invention, a memory device includes: first and second latch sections configured to respectively store a target address and a recent input address; a comparison unit configured to compare an input address with the target address and the recent input address respectively stored in the first and second latch sections, and output a resultant signal; a counting section configured to increase a count corresponding to the resent input address stored in the second latch section in response to the resultant signal; and a control unit configured to check the count of the counting section and update the input address to the second latch section in response to the resultant signal.

In accordance with an embodiment of the present invention, a memory system includes: a memory device including a plurality of word lines; and a memory controller configured to detect a target word line from the plurality of word lines and perform a refresh operation on adjacent word lines adjacent to the detected target word line, wherein the memory controller comprises: first and second latch sections configured to respectively store target addresses indicating the target word line and recently inputted addresses; a comparison unit configured to compare an input address with the target addresses and the recently inputted addresses respectively stored in the first and second latch sections, and output a resultant signal; and a counting section configured to increase counts corresponding to the recently inputted addresses stored in the second latch section in response to the resultant signal, wherein the memory controller checks the counts of the counting section and respectively updates the input address and the recently inputted addresses stored in the second latch section to the second latch section and the first latch section.

In accordance with an embodiment of the present invention, an operation method of a memory system includes: comparing an input address with target addresses; comparing the input address with recently inputted addresses when the input address does not match with the target addresses; increasing a count corresponding to an address matched with the input address among the recently inputted addresses; and updating the input address as the recently inputted addresses based on the counts corresponding to the recently inputted addresses when the input address does not match with the recently inputted addresses.

DETAILED DESCRIPTION

Figure 1:
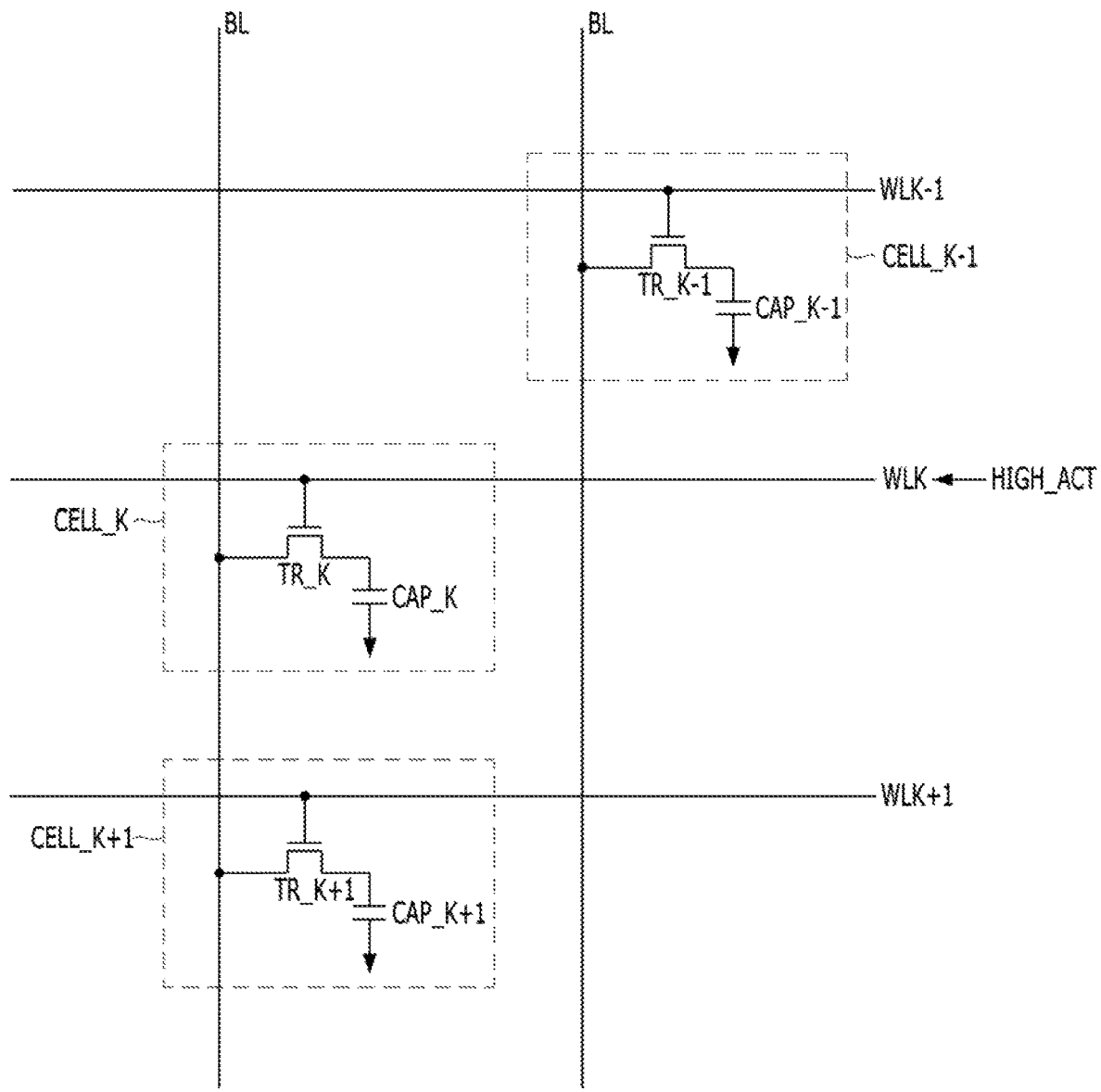
FIG. 1 is a diagram illustrating a part of a cell array included in a memory device, for explaining a row disturbance phenomenon.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that the drawings are simplified schematics and as such are not necessarily drawn to scale. In some instances, various parts of the drawings may have been exaggerated in order to more clearly illustrate certain features of the illustrated embodiments.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Figure 2:
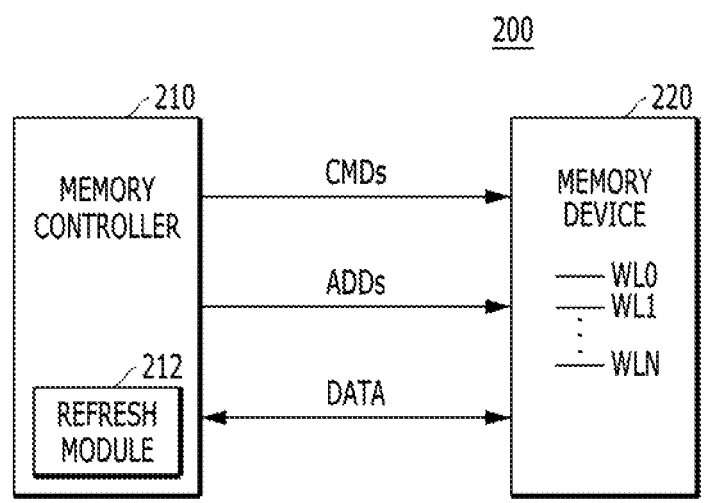
FIG. 2 is a block diagram of a memory system in accordance with an embodiment of the present invention.

FIG. 2 is a block diagram of a memory system 200 in accordance with an embodiment of the present invention.

Referring to FIG. 2, the memory system 200 may include a memory controller 210 and a memory device 220.

The memory controller 210 may control an operation of the memory device 220 by applying commands CMDs and addresses ADDs to the memory device 220, and exchange data DATA with the memory device 220 in read and write operations. That is, the memory controller 210 may transmit the commands CMDs such as an active command, a write command, a read command, a refresh command, a precharge command and the like to the memory device 220.

When the active command is transmitted, the memory controller 210 may transmit the addresses ADDs including row addresses to the memory device 220 in order to select a cell array and a word line to be activated of the memory device 220. When the write command or the read command is transmitted, the memory controller 210 may transmit the addresses ADDs including column addresses to the memory device 220 in order to select memory cells to be read or written, and particularly, when the write command is transmitted, the memory controller 210 may transmit data DATA to be written in the selected memory cells.

In order to refresh a plurality of word lines WL0 to WLN of the memory device 220, the memory controller 210 may input the refresh command to the memory device 220 at a predetermined cycle. Whenever the refresh command is inputted, the memory device 220 may refresh (activate and precharge) one or more word lines and may sequentially refresh all the plurality of word lines WL0 to WLN in a preset period.

In order to perform a target refresh operation on a specific word line of the memory device 220, the memory controller 210 may include a refresh module 212. The refresh module 212 may detect a frequently activated word line as a target word line of the plurality of word lines WL0 to WLN, and store a target address according to the detected target word line.

When the target word line is detected by the refresh module 212, the memory controller 210 may input the commands CMDs such that the memory device 220 enters a target refresh mode. When the memory device 220 enters the target refresh mode, the memory controller 210 may alternately input the active command and the precharge command to the memory device 220, and may input the target address together with the active command. The target address may include a row address indicating the target word line or an adjacent word line of the target word line. When the memory device 220 enters the target refresh mode, the memory device 220 may refresh (activate and precharge) one or more adjacent word lines in response to the active command and the precharge command.

However, the embodiment is not limited to the example illustrated in FIG. 2. For example, in a different embodiment from the one illustrated in FIG. 2, the refresh module 212 may be included in the memory device 220. In this case, the memory device 220 may detect a target word line, and perform a target refresh operation in response to the refresh command, which is inputted from the memory controller 210, together with a refresh operation on the plurality of word lines WL0 to WLN.

When the target word line is detected, the refresh module 212 may refresh one or more word lines adjacent to the target word line in response to the refresh command. For example, when the target word line is a $K^{th}$ word line in a cell array, the adjacent word lines may include a $K-1^{th}$ word line and a $K+1^{th}$ word line, that is, physically adjacent word lines to the $K^{th}$ word line in the cell array. The memory device 220 may refresh the one or more adjacent word lines and then may sequentially refresh the plurality of word lines WL0 to WLN.

Figure 3:
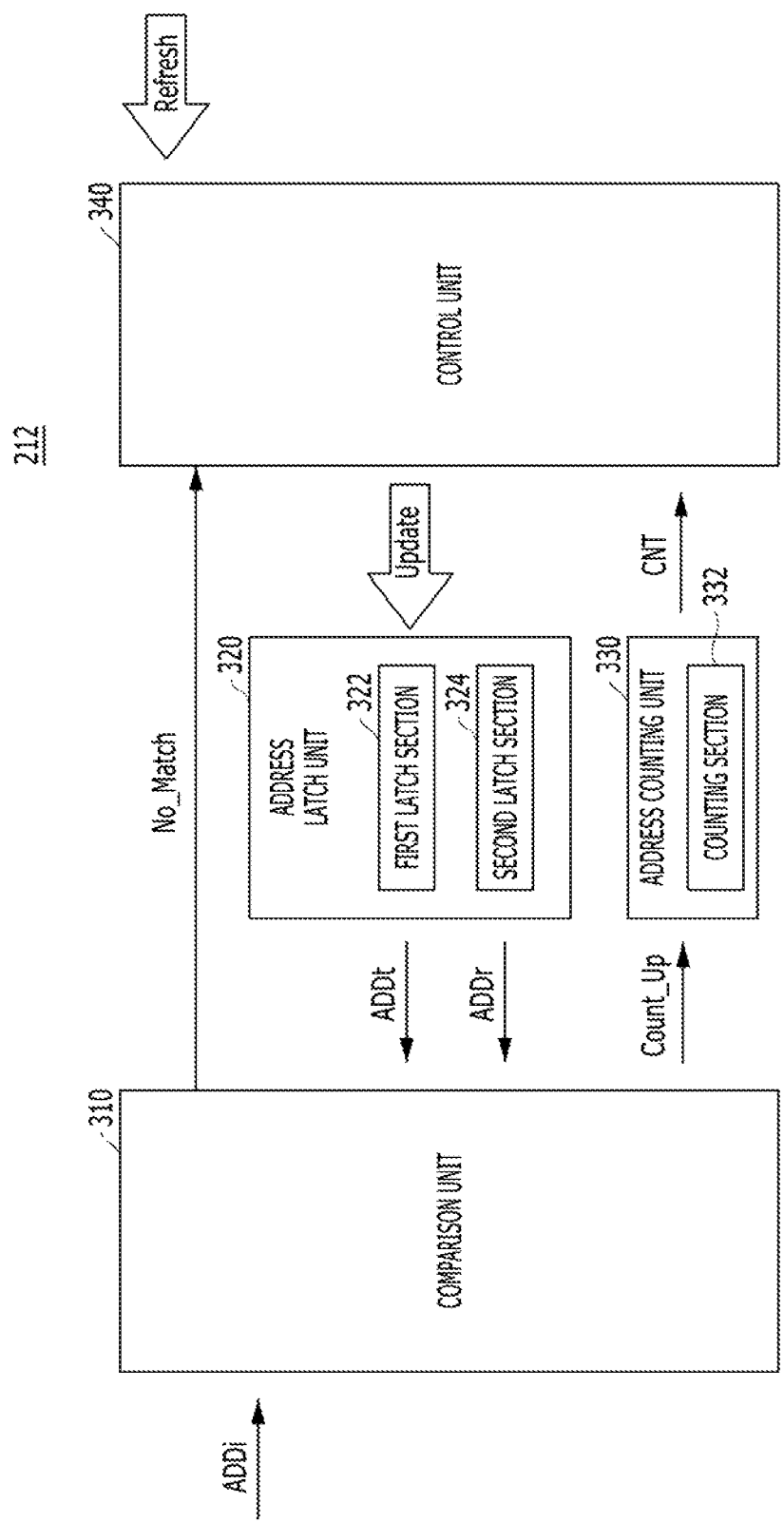
FIG. 3 is a block diagram illustrating a refresh module illustrated in FIG. 2.

FIG. 3 is a block diagram illustrating the refresh module 212 of FIG. 2.

Referring to FIG. 3, the refresh module 212 may include a comparison unit 310, an address latch unit 320, an address counting unit 330, and a control unit 340.

In accordance with the embodiment, the address latch unit 320 may include a first latch section 322 and a second latch section 324. The first latch section 322 and the second latch section 324 may store target addresses ADDt and recent input addresses ADDr, respectively. The address counting unit 330 may include a counting section 332 corresponding to the second latch section 324.

Figure 4:
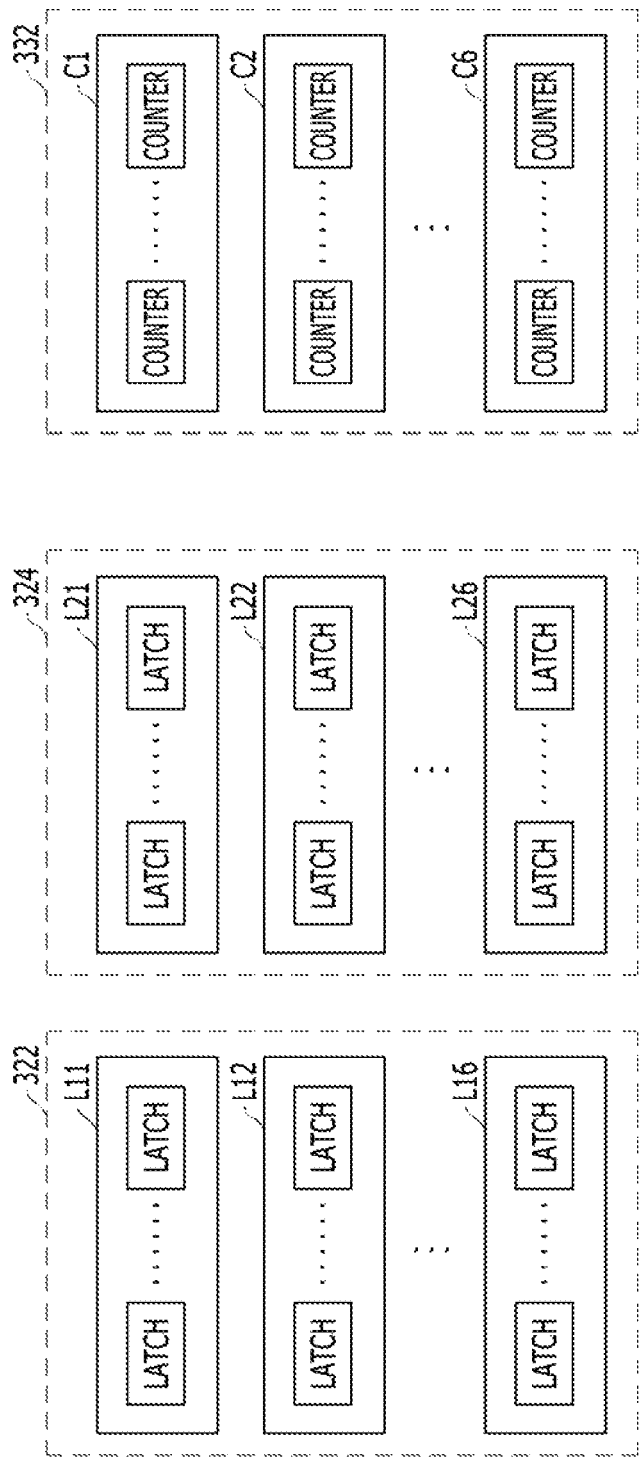
FIG. 4 is a detailed block diagram illustrating first and second latch sections and a counting section illustrated in FIG. 3.

FIG. 4 is a detailed block diagram illustrating the first and second latch sections 322 and 324 and the counting section 332 of FIG. 3.

Referring to FIG. 4, the first and second latch sections 322 and 324 may include a preset number of latch units L11 to L16 and L21 to L26, respectively. Each of the respective latch units L11 to L16 and L21 to L26 may include a plurality of latches LATCH. The number of the latches LATCH in each of the latch units L11 to L16 and L21 to L26 may correspond to the number of bits of the target address ADDt or the recent input address ADDr. Furthermore, the counting section 332 may also include a preset number of counting units C1 to C6 corresponding to the latch units L21 to L26 included in the second latch section 324. In accordance with the embodiment, the first and second latch sections 322 and 324 may include six first latch units L11 to L16 and six second latch units L21 to L26, respectively. The counting section 332 may include six counting units C1 to C6 corresponding to the second latch units L21 to L26.

The number of latch units and the number of counting units may be decided in consideration of the endurance or refresh operation characteristics of the memory device. In general, the memory device may perform an auto-refresh operation for sequentially refreshing a plurality of word lines in response to the refresh command from the memory controller. Furthermore, the memory device may perform a one-time target refresh operation in each auto-refresh operation period.

When one target word line WLK has been detected, a target refresh operation should be performed twice on upper and lower word lines WLK−1 and WLK+1 adjacent to the target word line WLK. Since a memory device performs a one-time target refresh operation in each auto-refresh operation period, the target refresh operation for the detected target word line WLK may be performed over two auto-refresh operation periods. Accordingly, on the basis of the endurance of the memory device, that is, the number of accesses permissible to one word line and an auto-refresh operation cycle, the minimum number of the target addresses to be stored and substantially managed for the target refresh operation may be set, and a number of latch units and counting units corresponding to the minimum number of target addresses may be provided.

With reference to FIG. 3 and FIG. 4, the operation of the refresh module in accordance with an embodiment will be described. When a new address ADDi is inputted, the comparison unit 310 may compare the input address ADDi with the target addresses ADDt and the recent input addresses ADDr stored in the address latch unit 320. The comparison unit 310 may sequentially compare the input address ADDi with the target addresses ADDt stored in the first latch units L11 to L16, and then may sequentially compare the input address ADDi with the recent input addresses ADDr stored in the second latch units L21 to L26.

When the input address ADDi matches with one of the target addresses ADDt stored in the first latch units L11 to L16, since the input address ADDi is an address already detected and updated as the target address ADDt, the comparison unit 310 does not perform the comparison operation with the target addresses ADDt, and may also omit the comparison operation with the recent input addresses ADDr. The input address ADDi is an address to be immediately subjected to a target refresh operation.

When the input address ADDi does not match with the target addresses ADDt stored in the first latch units L11 to L16, the comparison unit 310 may sequentially compare the input address ADDi with the recent input addresses ADDr stored in the second latch units L21 to L26. As a result of the comparison by the comparison unit 310, when the input address ADDi matches with one of the recent input addresses ADDr stored in the second latch units L21 to L26, the counting section 332 may increase a count of a counting unit corresponding to the second latch unit storing the matched address, among the counting units C1 to C6.

For example, during the sequential comparison of the input address ADDi and the recent input addresses ADDr stored in the second latch units L21 to L26, when the input address ADDi matches with an address stored in the second latch unit L22 of the second latch units L21 to L26, the comparison unit 310 may output a resultant signal Count_Up indicating the matching to the address counting unit 330. Accordingly, the counting section 332 may increase the count of the second counting unit C2 in response to the resultant signal Count_Up from the comparison unit 310.

However, when the input address ADDi does not match with the addresses stored in the first and second latch units L11 to L16 and L21 to L26, the comparison unit 310 may output a resultant signal No_Match indicating the non-matching to the control unit 340, and the control unit 340 may decide to update or not to update the address latch unit 320 in response to the resultant signal No_Match. That is, since the newly inputted address ADDi is neither the target address ADDt nor the recent input address ADDr, the control unit 340 may update the input address ADDi to the recent input address ADDr, that is, to the second latch section 324.

To this end, the control unit 340 may check a count CNT of the counting section 332 corresponding to the second latch section 324. That is, the control unit 340 may compare the counts CNT of the counting units C1 to C6 of the counting section 332 and detect a counting unit having the smallest count.

In accordance with an embodiment, the control unit 340 may check maximum values of the counts CNT of the counting units C1 to C6, that is, only Most Significant Bits (MSBs). Checking and comparing all the counts CNT of the counting units C1 to C6 may increase an operation time due to a complicated algorithm, resulting in an increase in a circuit area for the checking and comparing. The control unit 340 may reduce the operation time by checking only some value of the counts CNT, that is, the MSBs or Least Significant Bits (LSBs). Instead, the control unit 340 may change an order for checking the counts CNT of the counting units C1 to C6, thereby substantially preventing a specific counting unit from being continuously checked.

Accordingly, the control unit 340 may sequentially check the counts of the counting units C1 to C6, that is, the MSBs. When the control unit 340 sequentially checks the counts of the counting units C1 to C6 and finds a counting unit in which there is no maximum count, that is, the MSB is not '1', the control unit 340 may update the input address ADDi to a corresponding latch unit of the second latch units L21 to L26. For example, during the sequential checking of the counts of the counting units C1 to C6, when the second counting unit C2 does not have the maximum count, the control unit 340 may store the input address ADDi in the second latch unit L22 of the second latch section 324, which corresponds to the second counting unit C2. When all the counting units C1 to C6 have the maximum count, the recent input addresses ADDr stored in the second latch units L21 to L26 may be updated to the target addresses ADDt after a next target refresh operation. In this case, the newly inputted address ADDi may be discarded without being updated.

As described above, whenever checking the count CNT of the counting section 332, the control unit 340 may shift an order for checking the counts of the counting units C1 to C6. For example, the control unit 340 may check the counts in sequence of the first to sixth counting units C1 to C6, decide update, shift the counting units one by one, and then check the counts in sequence of the second to sixth counting units C2 to C6 and the first counting unit C1.

When the target refresh operation is performed for the target addresses ADDt, the control unit 340 may update the address latch unit 320 in response to the target refresh operation. That is, when the target refresh operation is performed for the target addresses ADDt stored in the first latch section 322, the control unit 340 may update the recent input addresses ADDr stored in the second latch section 324 to the target addresses ADDt, that is, to the first latch section 322. The target refresh operation may indicate a refresh operation on adjacent word lines of a target word line, corresponding to the target addresses ADDt.

The target refresh operation may be performed while the target addresses ADDt stored in the first latch units L1 to L16 of the first latch section 322 are being shifted one by one. For example, when the target refresh operation is performed for an address stored in the first latch unit L11 of the first latch units L11 to L16, the control unit 340 may shift the addresses stored in the remaining first latch units L12 to L16 one by one. Then, the control unit 340 may update the recent input addresses ADDr stored in the second latch section 324 to the shifted final latch unit, that is, the first latch unit L16 of the first latch units L11 to L16.

To this end, the control unit 340 may check the count CNT of the counting section 332 corresponding to the second latch section 324. That is, the control unit 340 may compare the counts CNT of the counting units C1 to C6 of the counting section 332 with one another, and detect the counting unit having the largest count.

As described above, the control unit 340 may check the maximum values of the counts of the counting units C1 to C6, that is, only the Most Significant Bits (MSBs). Accordingly, the control unit 340 may sequentially check the counts of the counting units C1 to C6, that is, the MSBs. When the control unit 340 sequentially checks the counts of the counting units C1 to C6 and finds a counting unit having the maximum count, that is, the MSB is '1', the control unit 340 may update a recent input address ADDr stored in a second latch unit corresponding to the counting unit having the maximum count to the shifted final latch unit of the first latch units 11 to L16 in the first latch section 322.

When all the counting units C1 to C6 do not have the maximum count, a recent input addresses ADDr of the second latch unit corresponding to the finally checked counting unit may be updated to the shifted final latch unit of the first latch units L11 to L16 in the first latch section 322. For example, during the sequential checking of the counts of the counting units C1 to C6, when the second counting unit C2 has the maximum count, the control unit 340 may update the recent input addresses ADDr stored in the second latch unit L22 of the second latch units L21 to L26, which corresponds to the second counting unit C2, to the shifted final latch unit L16 of the first latch units L11 to L16. However, during the sequential checking of the counts of the counting units C1 to C6, when the maximum count is not checked, the control unit 340 may update the recent input addresses ADDr stored in the second latch unit L26 of the second latch units L21 to L26, which corresponds to the finally checked counting unit C6, to the shifted final latch unit L16 of the first latch units L11 to L16.

Whenever checking the count CNT of the counting section 332, the control unit 340 may shift the order for checking the counts of the counting units C1 to C6. For example, the control unit 340 may check the counts in sequence of the first to sixth counting units C1 to C6, perform an update, shift the counting units one by one, and then check the counts in sequence of the second to sixth counting units C2 to C6 and the first counting unit C1. After the update, the control unit 340 may reset the count of a corresponding counting unit.

Figure 5:
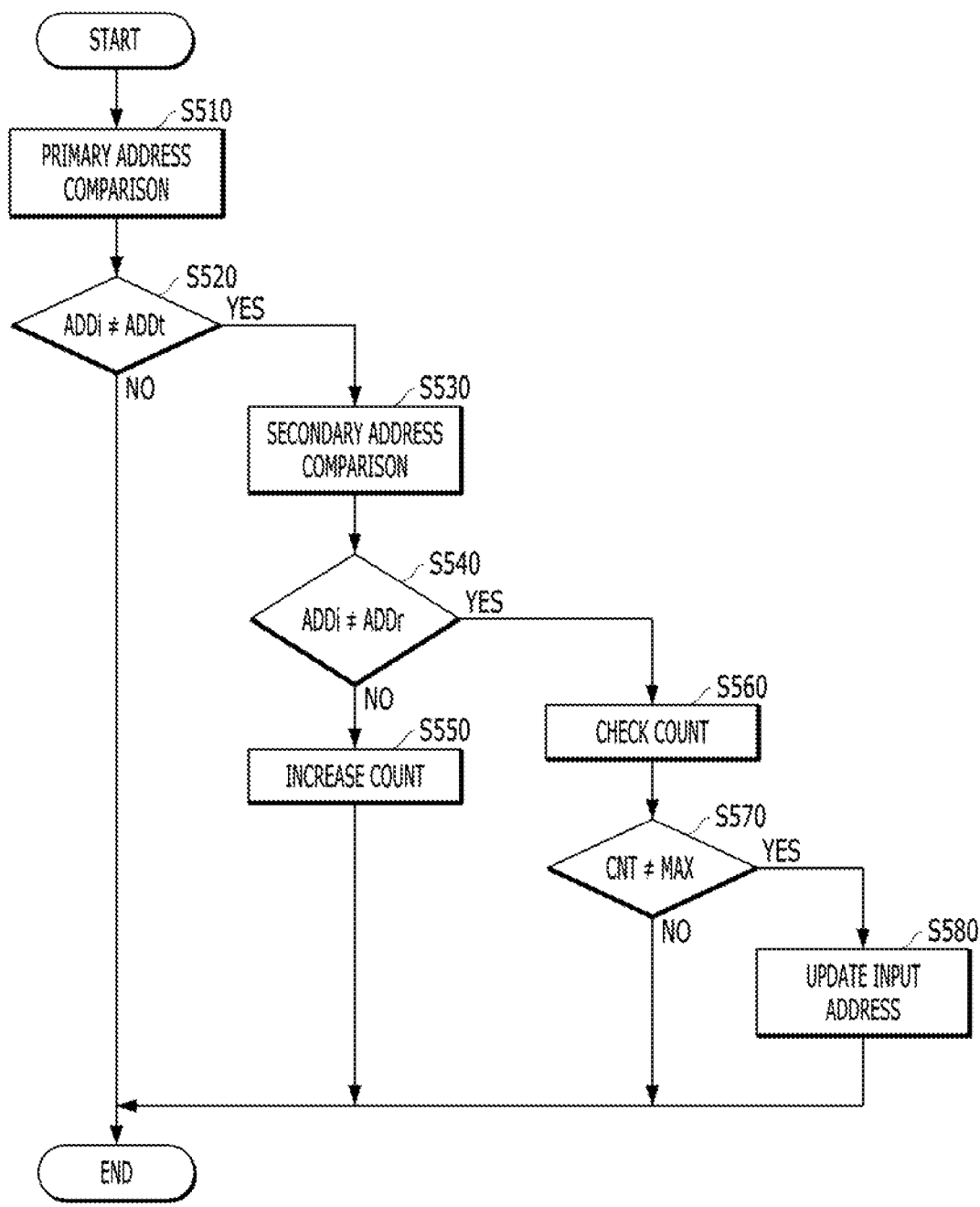
FIG. 5 and FIG. 6 are flowcharts for explaining an operation of a memory system in accordance with an embodiment of the present invention.
Figure 6:
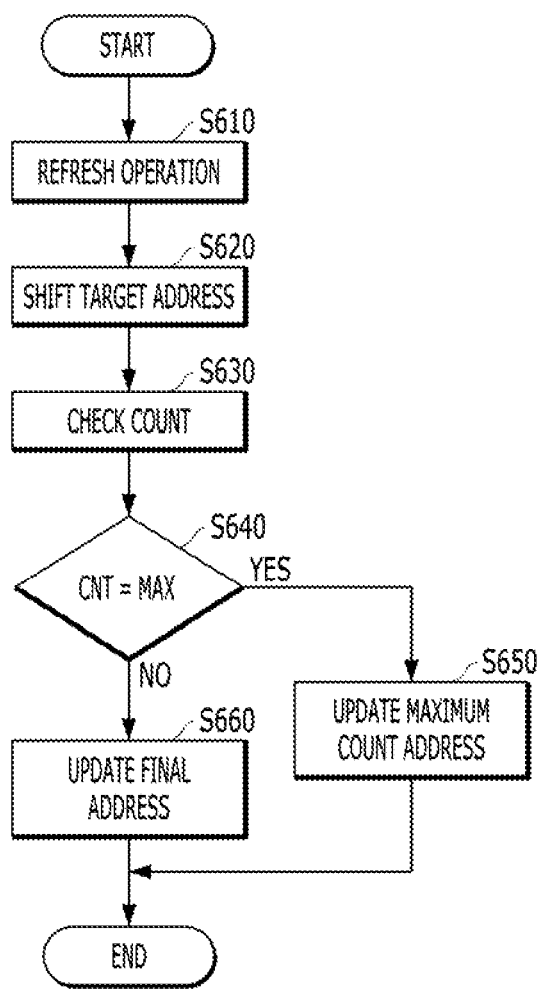

FIG. 5 and FIG. 6 are flowcharts explaining an operation of a memory system in accordance with an embodiment of the present invention. In more detail, FIG. 5 illustrates an update operation of the recent input address ADDr, and FIG. 6 illustrates an update operation of the target address ADDt.

Referring to FIG. 5, when a row address for activating a word line of the memory device 220 (see FIG. 2) is received, the comparison unit 310 (see FIG. 3) may primarily compare the input address ADDi with the target addresses ADDt stored in the address latch unit 320 (see FIG. 3) (S510). In this case, the comparison unit 310 may sequentially compare the input address ADDi with the target addresses ADDt stored in the first latch units L11 to L16 (see FIG. 4) of the first latch section 322 (see FIG. 3).

As a result of the primary comparison operation, when the input address ADDi matches with the target addresses ADDt (NO, S520), since the input address ADDi is an address to be immediately subjected to the target refresh operation, the procedure may end. However, when as the result of the primary comparison operation the input address ADDi does not match with the target addresses ADDt (YES, S520), the comparison unit 310 may perform a secondary comparison of the input address ADDi with the recent input addresses ADDr stored in the address latch unit 320 (S530). In this case, the comparison unit 310 may sequentially compare the input address ADDi with the recent input addresses ADDr stored in the second latch units L21 to L26 (see FIG. 4) of the second latch section 324 (see FIG. 3).

As a result of the secondary comparison operation, when the input address ADDi matches with the recent input addresses ADDr (NO, S540), the address counting unit 330 (see FIG. 3) may increase a count corresponding to the matched recent input addresses ADDr (S550). That is, the counting section 332 (see FIG. 3) may increase a count of a counting unit of the counting units C1 to C6 (see FIG. 4) of the address counting unit 330, corresponding to a latch unit for storing the address matched with the input address ADDi, among the second latch units L21 to L26 of the second latch section 324.

However, when the input address ADDi does not match with the recent input addresses ADDr (YES, S540), the control unit 340 may update the input address ADDi to the recent input addresses ADDr based on counts corresponding to the recent input addresses ADDr. To this end, the control unit 340 may sequentially check the counts corresponding to the recent input addresses ADDr (S560). As a result of the checking operation, when a recent input address corresponding to no maximum count is found from the recent input addresses ADDr (YES, S570), the control unit 340 may update the input address ADDi as the founded recent input address (S580).

In detail, the control unit 340 may sequentially check the counts of the counting units C1 to C6 of the counting section 332 that corresponds to the second latch section 324 storing the recent input addresses ADDr. During the sequential checking, when a counting unit having no maximum count is found from the counting units C1 to C6, the control unit 340 may store the input address ADDi in a corresponding latch unit of the second latch units 121 to L26 of the second latch section 324.

When all the counting units C1 to C6 of the address counting unit 330 have the maximum count (NO, S570), the input address ADDi may be discarded without being updated to the recent input addresses ADDr. Whenever deciding to update or not to update, the control unit 340 may shift an order for checking the counts of the counting units C1 to C6.

Referring to FIG. 6, the target refresh operation may be performed for the target addresses ADDt stored in the address latch unit 320 (S610). Accordingly, the control unit 340 may update the recent input addresses ADDr to the target addresses ADDt on the basis of counts corresponding to the recent input addresses ADDr.

The control unit 340 may shift the target addresses ADDt stored in the first latch units L11 to L16 of the first latch section 322 one by one (S620). For example, when the target refresh operation is performed for an address stored in a latch unit of the first latch units L11 to L16, addresses stored in the remaining first latch units may be shifted one by one.

Then, the control unit 340 may sequentially check the counts corresponding to the recent input addresses ADDr (S630). As a result of the checking operation, when a recent input address corresponding to a maximum count is found from the recent input addresses ADDr (YES, S640), the control unit 340 may update a founded recent input address as a shifted target address, that is, to the shifted final latch unit of the first latch section 322 (S650).

In detail, the control unit 340 may sequentially check the counts of the counting units C1 to C6 of the counting section 332 that corresponds to the second latch section 324 storing the recent input addresses ADDr. During the sequential checking, when a counting unit having a maximum count is found, the control unit 340 may store a recent input address ADDr, which has been stored in a corresponding latch unit of the second latch units L21 to L26 of the second latch section 324, in the shifted final latch unit of the first latch units L11 to L16 in the first latch section 322.

When all the counting units C1 to C6 of the address counting unit 330 do not have the maximum count (NO, S640), the control unit 340 may update a recent input address ADDr, which has been stored in a second latch unit corresponding to the finally checked counting unit, among the second latch units L21 to 126 of the second latch section 324, to the shifted final latch unit of the first latch section 322 (S660). Whenever performing the update, the control unit 340 may shift an order for checking the counts of the counting units C1 to C6.

In the present technology, a word line frequently accessed is detected in the memory device and a refresh operation is performed on word lines adjacent to the detected word line, so that an interference phenomenon among the word lines may be reduced. Particularly, in performing a comparison of a count of an address corresponding to a word line for detecting a word line or updating the detected word line, the overhead of the memory system for a refresh operation of the memory device may be reduced by checking only some of the counts.

Furthermore, when comparing only some of the counts, the comparison order may also be shifted, so that a specific address may be substantially prevented from being continuously selected for detection or update of a word line. Accordingly, a circuit area may be reduced using a minimum algorithm, and an error may be prevented from occurring. That is, the memory system of the present invention may improve the refresh operation efficiency of the memory device even in a limited area.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   first and second latch circuits configured to respectively store a target address and a recent input address;
   a comparison circuit configured to compare an input address with the target address and the recent input address respectively stored in the first and second latch circuits, and output a resultant signal;
   a counting circuit configured to increase a count corresponding to the recent input address stored in the second latch circuit in response to the resultant signal; and
   a control circuit configured to check the count of the counting circuit and update the input address to the second latch circuit in response to the resultant signal.

2. The memory device of claim 1, wherein, when a refresh operation is performed for the target address stored in the first latch circuit, the control circuit checks the count of the counting circuit and updates the recent input address stored in the second latch circuit, to the first latch circuit.

3. The memory device of claim 2, wherein the control circuit checks a most significant bit of the count of the counting circuit and respectively updates the input address and the recent input address stored in the second latch circuit, to the second latch circuit and the first latch circuit, in response to the resultant signal.

4. The memory device of claim 1, wherein each of the first and second latch circuits includes a plurality of latch circuits for storing a preset number of the corresponding addresses, and the counting circuit includes a plurality of counting circuits corresponding to the latch circuits of the second latch circuit.

5. The memory device of claim 4, wherein, when the input address does not match with any of the target address and the recent input address, the control circuit sequentially checks counts of the counting circuits to detect a counting circuit having no maximum count, and updates the input address to a latch circuit of the second latch circuit, which corresponds to the detected counting circuit.

6. The memory device of claim 5, wherein, when checking the counts of the counting circuits, the control circuit shifts an order for checking the counts of the counting circuits.

7. The memory device of claim 4, wherein, when a refresh operation is performed for an address stored in a latch circuit of the first latch circuit, the control circuit shifts addresses of the remaining latch circuits of the first latch circuit one by one.

8. The memory device of claim 7, wherein the control circuit sequentially checks counts of the counting circuits to detect a counting circuit having a maximum count, and updates an address stored in a latch circuit of the second latch circuit, which corresponds to the detected counting circuit, to a shifted final latch circuit of the first latch circuit.

9. The memory device of claim 8, wherein, when checking the counts of the counting circuits, the control circuit shifts an order for checking the counts of the counting circuits.

10. The memory device of claim 4, wherein the comparison circuit sequentially compares the input address with the target addresses stored in the latch circuits of the first latch circuit, and sequentially compares the input address with the recent input addresses stored in the latch circuits of the second latch circuit when there is no match between the input address and the target addresses.

11. The memory device of claim 4, wherein the counting circuit increases a count of a counting circuit corresponding to a latch circuit storing a recent input address matched with the input address, among the latch circuits of the second latch circuit.

12. A memory system comprising:
a memory device including a plurality of word lines; and
a memory controller configured to detect a target word line from the plurality of word lines and perform a refresh operation on adjacent word lines adjacent to the detected target word line,
wherein the memory controller comprises:
first and second latch circuits configured to respectively store target addresses indicating the target word line and recently inputted addresses;
a comparison circuit configured to compare an input address with the target addresses and the recently inputted addresses respectively stored in the first and second latch circuits, and output a resultant signal; and
a counting circuit configured to increase counts corresponding to the recently inputted addresses stored in the second latch circuit in response to the resultant signal,
wherein the memory controller checks the counts of the counting circuit and respectively updates the input address and the recently inputted addresses stored in the second latch circuit to the second latch circuit and the first latch circuit.

13. The memory system of claim 12, wherein, when the input address does not match with any of the target addresses and the recently inputted addresses, the memory controller updates the input address as an address in which a corresponding count is not maximum, among the recently inputted addresses stored in the second latch circuit.

14. The memory system of claim 12, wherein, when a refresh operation is performed for the target addresses stored in the first latch circuit, the memory controller updates an address in which a corresponding count is maximum, among the recently inputted addresses stored in the second latch circuit, to the first latch circuit.

15. An operation method of a memory system, comprising:
comparing an input address with target addresses;
comparing the input address with recently inputted addresses when the input address does not match with the target addresses;
increasing a count corresponding to an address matched with the input address among the recently inputted addresses; and
updating the input address as the recently inputted addresses based on the counts corresponding to the recently inputted addresses when the input address does not match with the recently inputted addresses.

16. The operation method of the memory system of claim 15, wherein the updating of the input address as the recently inputted addresses comprises:
sequentially checking the counts corresponding to the recently inputted addresses to detect a recently inputted address corresponding to no maximum count; and
updating the input address as the detected recently inputted address.

17. The operation method of the memory system of claim 16, further comprising:
when updating of the input address as the recently inputted addresses, shifting an order for checking the counts corresponding to the recently inputted addresses is shifted.

18. The operation method of the memory system of claim 15, further comprising:
performing a refresh operation for the target addresses; and
updating the recently inputted addresses to the target addresses based on the counts corresponding to the recently inputted addresses.

19. The operation method of the memory system of claim 18, wherein the updating of the recently inputted addresses to the target addresses comprises:
shifting the target addresses;
sequentially checking the counts corresponding to the recently inputted addresses to detect a recently inputted address corresponding to a maximum count;
updating the detected recently inputted address to a shifted target address; and
updating a recently inputted address for which a count is finally checked, to the shifted target address when the recently inputted addresses corresponding to the maximum count is not detected.

20. The operation method of the memory system of claim 19, further comprising:
when updating of the recently inputted addresses to the target addresses, an order for checking the counts corresponding to the recently inputted addresses is shifted.

* * * * *